United States Patent
Ueno et al.

(10) Patent No.: US 10,593,725 B2
(45) Date of Patent: Mar. 17, 2020

(54) LIGHT SOURCE MODULE, ILLUMINATION DEVICE AND MOVING BODY

(71) Applicant: PANASONIC INTELLECTUAL PROPERTY MANAGEMENT CO., LTD., Osaka (JP)

(72) Inventors: Yasuharu Ueno, Osaka (JP); Hiroya Tsuji, Kyoto (JP); Yoshihiko Kanayama, Hyogo (JP); Tomoyuki Ogata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 62 days.

(21) Appl. No.: 15/903,256

(22) Filed: Feb. 23, 2018

(65) Prior Publication Data

US 2018/0247972 A1  Aug. 30, 2018

(30) Foreign Application Priority Data

Feb. 27, 2017 (JP) ................... 2017-035240

(51) Int. Cl.
| | |
|---|---|
| H01L 27/15 | (2006.01) |
| F21S 41/153 | (2018.01) |
| F21S 41/19 | (2018.01) |
| H01L 25/075 | (2006.01) |
| F21S 41/663 | (2018.01) |

(Continued)

(52) U.S. Cl.
CPC .............. *H01L 27/156* (2013.01); *B60Q 1/04* (2013.01); *F21S 41/143* (2018.01); *F21S 41/153* (2018.01); *F21S 41/192* (2018.01); *F21S 41/25* (2018.01); *F21S 41/663* (2018.01); *H01L 23/528* (2013.01); *H01L 25/0753* (2013.01); *H01L 27/0248* (2013.01); *H01L 29/866* (2013.01); *H01L 29/8611* (2013.01); *H01L 33/62* (2013.01)

(58) Field of Classification Search
CPC combination set(s) only.
See application file for complete search history.

(56) References Cited

U.S. PATENT DOCUMENTS

| | | | |
|---|---|---|---|
| 2013/0001599 A1* | 1/2013 | Lee | H01L 25/167 257/88 |
| 2013/0038246 A1* | 2/2013 | Sasano | H01L 25/0753 315/312 |

(Continued)

FOREIGN PATENT DOCUMENTS

| | | |
|---|---|---|
| JP | 2002-335012 | 11/2002 |
| JP | 2008-218674 | 9/2008 |

*Primary Examiner* — Janese Duley
(74) *Attorney, Agent, or Firm* — Greenblum & Bernstein, P.L.C.

(57) ABSTRACT

A light source module is provided. According to an exemplary embodiment, the light source module includes a base material. A plurality of light sources is on a surface of the substrate in a matrix. The plurality of light sources is individually controlled to be lit. A first electric supply wire supplies electricity to each of the plurality of light sources. A plurality of second electric supply wires supplies electricity to the plurality of light sources respectively. A plurality of protection diodes is electrically connected with the first electric supply wire and the plurality of second electric supply wires. The plurality of protection diodes is in the substrate.

15 Claims, 9 Drawing Sheets

(51) Int. Cl.
*F21S 41/25* (2018.01)
*F21S 41/143* (2018.01)
*B60Q 1/04* (2006.01)
*H01L 23/528* (2006.01)
*H01L 29/861* (2006.01)
*H01L 29/866* (2006.01)
*H01L 33/62* (2010.01)
*H01L 27/02* (2006.01)

(56) References Cited

U.S. PATENT DOCUMENTS

2013/0299854 A1* 11/2013 Lee .................. H01L 33/62
    257/88
2017/0154880 A1* 6/2017 Ozeki ................ H01L 33/60

\* cited by examiner

LIGHT SOURCE MODULE, ILLUMINATION DEVICE AND MOVING BODY

CROSS REFERENCE TO RELATED APPLICATION

The entire disclosure of Japanese Patent Application No. 2017-035240 filed on Feb. 27, 2017, including specification, claims, drawings and abstract, is incorporated herein by reference in its entirety.

TECHNICAL FIELD

The present disclosure relates to a light source module, an illumination device and a moving body.

BACKGROUND

Conventionally, there is known a light source module including a light source array in which a plurality of light sources are arranged in a matrix. For example, Patent Literature 1 discloses a light-emitting display device that two-dimensionally arrays light-emitting units including light-emitting diodes (LEDs) and formed in a dotted manner and that configures and displays a desired letter, symbol or drawing pattern while arbitrarily combining the displays of the units. Further, Patent Literature 2 discloses a shell-shape type LED in which a trigger diode chip that is a semiconductor protection element for electrically protecting a light-emitting element is connected in inverse-parallel to an LED chip.

CITATION LIST

Patent Literature

[Patent Literature 1] JP 2008-218674 A
[Patent Literature 2] JP 2002-335012 A

SUMMARY

Technical Problem

It should be noted that also in a light source module including a light source array in which a plurality of light sources are arrayed in a high density, it is necessary to provide a plurality of protection elements for protecting the light sources against static electricity or the like. Meanwhile, in the case of a configuration in which the light sources can be individually controlled to be lit, it is necessary to provide the same number of electric supply wires as the number of the light sources, on at least one of the plus side and the minus side, and therefore, it is not easy to secure the arrangement space for the protection elements.

Solution to Problem

A light source module in an aspect of the present disclosure includes: a substrate; a plurality of light sources on a surface of the substrate in a matrix, the plurality of light sources being individually controlled to be lit; a first electric supply wire for supplying electricity to each of the plurality of light sources; a plurality of second electric supply wires for supplying electricity to the plurality of light sources respectively; and a plurality of protection diodes electrically connected with the first electric supply wire and the plurality of second electric supply wires.

An illumination device in an aspect of the present disclosure includes the above light source module. A moving body in an aspect of the present disclosure includes the above light source module.

Advantageous Effects of Invention

According to an aspect of the present disclosure, it is possible to provide a light source module that allows individual lighting control of the plurality of light sources constituting the light source array, and that allows a countermeasure against static electricity with space saving. According to the light source module in an aspect of the present disclosure, it is possible to array the plurality of light sources in a matrix and in a high density.

BRIEF DESCRIPTION OF DRAWINGS

Embodiments of the present disclosure will be described based on the following figures, wherein.

DESCRIPTION OF EMBODIMENTS

Hereinafter, exemplary embodiments of a light source module, an illumination device and a moving body according to the present disclosure will be described in detail with reference to the drawings. The reference drawings in the description of the embodiments are schematic drawings, and therefore, the dimensional ratio of each constituent element, and the like should be determined in consideration of the following description. In the present specification, the expression "nearly parallel", for example, is intended to include not only a perfectly parallel state but also a state that is regarded as being substantially parallel.

In the description of the embodiments, a headlight 2 of an automobile will be exemplified as an illumination device on which a light source module according to the present disclosure is mounted, but the illumination device in the present disclosure is not limited this. The illumination device in the present disclosure may be an illumination device for apparatuses such as a display, a projector and a signal, may be an illumination device for facilities such as a house, a store, an office, a factory, a commercial facility, a public facility and an outdoor facility, or may be an illumination device for moving bodies other than the headlight of the automobile.

As the moving body on which the light source module according to the present disclosure is mounted, an automobile 1 including the headlight 2 is exemplified, but the moving body in the present disclosure is not limited to automobiles (including motor cycles). The moving body in the present disclosure may be a railway vehicle, an airplane, a helicopter, a ship, a bicycle or the like.

Figure 1:
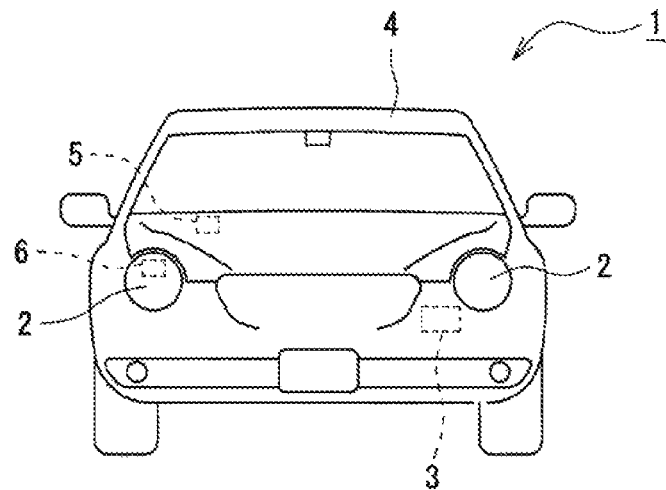
FIG. 1 is a front view of a moving body according to an exemplary embodiment.

FIG. 1 is a front view of the automobile 1 according to an exemplary embodiment. As illustrated in FIG. 1, the automobile 1 includes headlights 2 and a battery 3 for supplying electric power to the headlights 2. At a front end portion of a vehicle body 4, the headlights 2 are provided on both sides of the vehicle body 4 in the width direction, respectively. The automobile 1 includes a switch 5 for turning the headlights 2 on/off, and a drive circuit 6 that controls the action of the headlights 2. Generally, the switch 5 is disposed at a driver seat, and is operated by a driver. However, the headlight 2 may be automatically turned on/off, using an illumination sensor or the like.

The drive circuit 6 is disposed at the headlight 2 or near the headlight 2. In addition to the on/off control of the headlights 2, based on the operation of the switch 5 or the like, the drive circuit 6 may execute the light modulation, color tone and others of the headlights 2. The drive circuit 6 receives a control command, for example, from a vehicle control system (not illustrated) that controls the whole of the automobile 1, and controls the action of the headlights 2 based on the control command.

Figure 2:
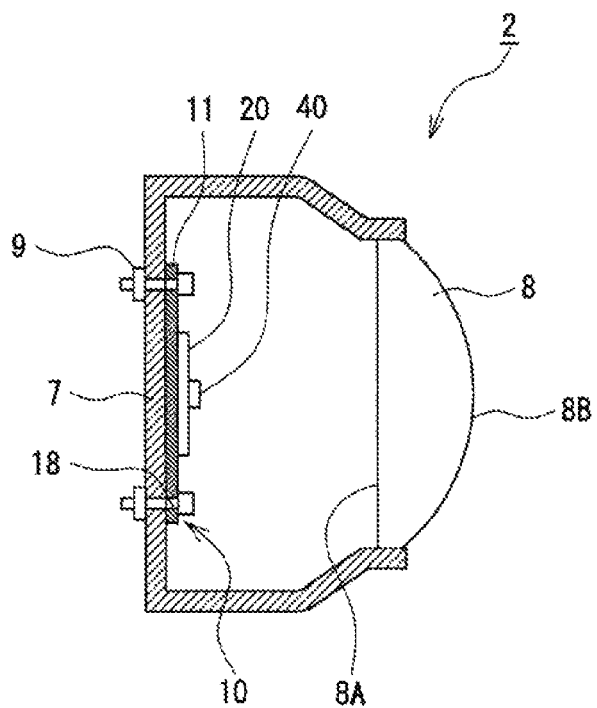
FIG. 2 is a sectional view of an illumination device according to an exemplary embodiment.

FIG. 2 is a sectional view of the headlight 2 according to an exemplary embodiment. As illustrated in FIG. 2, the headlight 2 includes a cylindrical case 7, a projection lens 8 attached to one end portion in the axial direction of the case 7, and a light source module 10 arranged in the case 7. The light source module 10, which includes a light source array 40, is arranged in the case 7 while the light source array 40 is oriented to the side of the projection lens 8. The light source array 40 includes a plurality of light sources 41 that are mounted on the surface of a primary wiring substrate 20 in a matrix (see FIG. 3 and the like). Preferably, a light source 41 should be a semiconductor light-emitting element, and particularly, should be a light-emitting diode (LED). Hereinafter, the description will be made on the assumption that the light source 41 is an LED.

The case 7, for example, has a bottomed cylindrical shape in which one end in the axial direction is opened. The shape of the projection lens 8 is not particularly limited. FIG. 2 illustrates a plano-convex lens in which a light incidence surface 8A oriented to the inside of the case 7 is a plane surface and a light emission surface 8B oriented to the outside of the case 7 is a convex surface. The headlight 2 has a structure in which the projection lens 8 is fixed to the one end portion in the axial direction so as to close the opening of the case 7 and the light source module 10 is fixed to a wall surface (bottom surface) of the case 7 that faces the projection lens 8.

The light source module 10 includes a secondary wiring substrate 11 on which the primary wiring substrate 20 is mounted, and is fixed to the wall surface of the case 7 using fastening members 9 such as a bolt and a nut. A plurality of through-holes 18 for attaching the fastening members 9 are formed on the secondary wiring substrate 11. To the plurality of light sources 41 constituting the light source array 40, electric power is supplied from the battery 3, by the drive circuit 6. The drive circuit 6 includes a plurality of switching elements corresponding to the light sources 41, and can independently perform the lighting control of the individual light sources 41.

Figure 3:
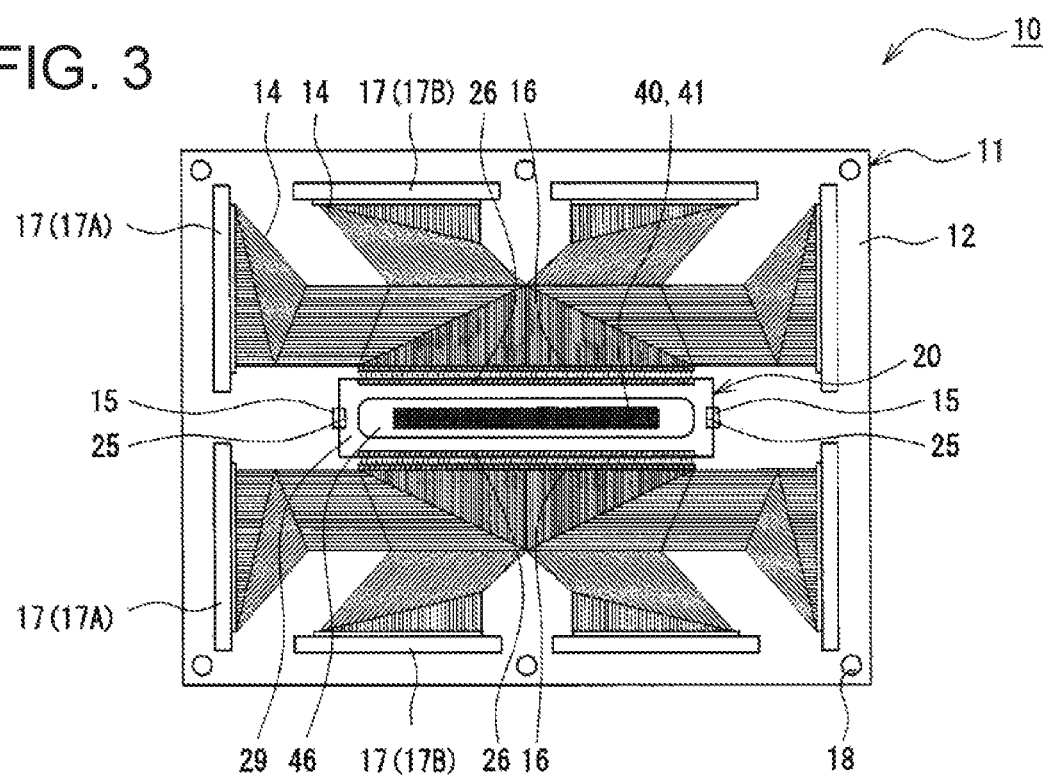
FIG. 3 is a plan view of a light source module according to an exemplary embodiment.

The light source array 40 of the light source module 10 is configured such that the plurality of light sources 41 are arrayed in a matrix, and has a planar-view band shape in which the length in the row direction is longer than the length in the column direction (see FIG. 3). It is desired that the headlight 2 of the automobile 1 can radiate light more widely in the horizontal direction than in the vertical direction. Therefore, the light source module 10 is fixed in the case 7 such that the longer direction (row direction) of the light source array 40 is along the horizontal direction.

The structure of the headlight 2 is not limited to the structure illustrated in FIG. 2. For example, the light source module 10 may be fixed to the case 7, through an attachment member to which the secondary wiring substrate 11 is fixed. Further, in the case 7, there may be provided a reflector that reflects the light of the light source module 10 to the side of the projection lens 8.

FIG. 3 is a plan view of the light source module 10 according to an exemplary embodiment. As illustrated in FIG. 3, the light source module 10 includes the secondary wiring substrate 11, and the primary wiring substrate 20 mounted on the secondary wiring substrate 11. As described above, the light source array 40 is mounted on the primary wiring substrate 20. Preferably, the light source array 40 should be configured such that many light sources 41 are arrayed in a matrix and in a high density. As described later in detail, the light source module 10 has a structure that allows individual lighting control of the plurality of light sources 41 constituting the light source array 40, and that allows a countermeasure against static electricity with space saving.

Both the secondary wiring substrate 11 and the primary wiring substrate 20 have planar-view rectangular shapes. The primary wiring substrate 20 is shorter than the secondary wiring substrate 11 in the lengths of the longer side and the shorter side, and is thinner than the secondary wiring substrate 11. The primary wiring substrate 20 is arranged at a central portion of the secondary wiring substrate 11, such that the longer sides of the substrates are nearly parallel to each other and the shorter sides of the substrates are nearly parallel to each other. The primary wiring substrate 20 may be soldered to the surface of the secondary wiring substrate 11, or may be bonded using an adhesive. The planar-view shapes of the substrates are not limited to rectangular shapes, and may be square shapes.

The secondary wiring substrate 11 includes a base substrate 12 having a planar-view rectangular shape, electric supply wires 14 formed on the surface side of the base substrate 12, and connectors 17 to which the electric supply wires 14 are connected. The plurality of through-holes 18 are formed on the secondary wiring substrate 11. The base substrate 12 is a parent material of the secondary wiring substrate 11, and functions as a support for the electric supply wires 14 and the like.

As the base substrate 12, for example, a metal substrate, a semiconductor substrate, a ceramic substrate, a resin substrate or the like is used. In the case of using a conductive substrate, it is necessary to provide an insulating layer between the surface of the substrate and the electric supply wires 14. For example, the electric supply wires 14 are composed of a metal containing aluminum, copper, tungsten, silver, gold or the like as the primary component. Preferably, aluminum or copper should be used, in consideration of conductivity, material cost and the like.

The secondary wiring substrate 11 includes electric supply pads that are formed around the primary wiring substrate 20. The electric supply pads include secondary-substrate-side first electric supply pads 15 that are electrically connected with first electric supply pads 25 of the primary wiring substrate 20, and secondary-substrate-side second electric supply pads 16 that are electrically connected with second electric supply pads 26 of the primary wiring substrate 20. For example, each electric supply pad is composed of the same metal as the electric supply wire 14.

The electric supply pads of the secondary wiring substrate 11 are connected with the electric supply pads of the primary wiring substrate 20, for example, through metal wires of gold or the like. The number of the formed electric supply pads of the secondary wiring substrate 11 is the same as the number of the corresponding electric supply pads of the primary wiring substrate 20. The first electric supply pads 25 of the primary wiring substrate 20 are formed at both longer-directional end portions of the primary wiring substrate 20, respectively, and therefore, the secondary-substrate-side first electric supply pads 15 are formed at vicinities of both longer-directional end portions of the primary wiring substrate 20, respectively.

On the other hand, the plurality of second electric supply pads 26 of the primary wiring substrate 20 are formed at both shorter-directional end portions of the primary wiring substrate 20, and therefore, the secondary-substrate-side second electric supply pads 16 are formed at vicinities of both shorter-directional end portions of the primary wiring substrate 20, respectively. On the secondary wiring substrate 11, there are formed two arrays (hereinafter, referred to as "arrays R(16)"), each of which is formed by arraying a plurality of secondary-substrate-side second electric supply pads 16 on a line along the longer direction of the primary wiring substrate 20, such that the primary wiring substrate 20 is sandwiched from both shorter-directional ends.

In the light source module 10, the plurality of connectors 17 are arranged so as to surround the primary wiring substrate 20 that is mounted at the central portion of the secondary wiring substrate 11. Specifically, two connectors 17 are arranged at each of both longer-directional end portions of the secondary wiring substrate 11, along the shorter direction, and two connectors 17 are disposed at each of both shorter-directional end portions, along the longer direction, so that a total of eight connectors 17 are arranged. Hereinafter, the connectors 17 arranged at both longer-directional end portions of the secondary wiring substrate 11 are referred to as "connectors 17A", and the connectors 17 arranged at both shorter-directional end portions are referred to as "connectors 17B".

The electric supply wires 14 are wires that connect the plurality of secondary-substrate-side second electric supply pads 16 and terminals (not illustrated) of the plurality of connectors 17 with each other, and extend from vicinities of both shorter-directional end portions of the primary wiring substrate 20, in the four directions of the secondary wiring substrate 11. The number of the formed electric supply wires 14 is the same as the number of the secondary-substrate-side second electric supply pads 16. Each of the plurality of electric supply wires 14 is a wire for supplying electricity to the second electric supply pad 26 of the primary wiring substrate 20 through the secondary-substrate-side second electric supply pad 16, and also functions as a heat transfer path for radiating the heat of the light source array 40 in the four directions of the secondary wiring substrate 11.

The plurality of electric supply wires 14 connect the secondary-substrate-side second electric supply pads 16 and the terminals of the connectors 17 in one-to-one correspondence. For example, a plurality of electric supply wires 14 extending from two adjacent connectors 17A, 17B are respectively connected with secondary-substrate-side second electric supply pads 16 that constitute half of an array R(16) near the two connectors. The plurality of electric supply wires 14 extending from the connector 17A and the plurality of electric supply wires 14 extending from the connector 17B are formed to be laminated with insulating layers in the thickness direction of the secondary wiring substrate 11, and are alternately connected with the secondary-substrate-side second electric supply pads 16.

On the primary wiring substrate 20, the light source array 40 is mounted at the center of the substrate, and a light-blocking member 46 is provided around the light source array 40. Further, the surface of the primary wiring substrate 20 is covered with an insulating layer 29, except portions corresponding to electrodes of the electric supply pads and the light sources 41.

Figure 4:
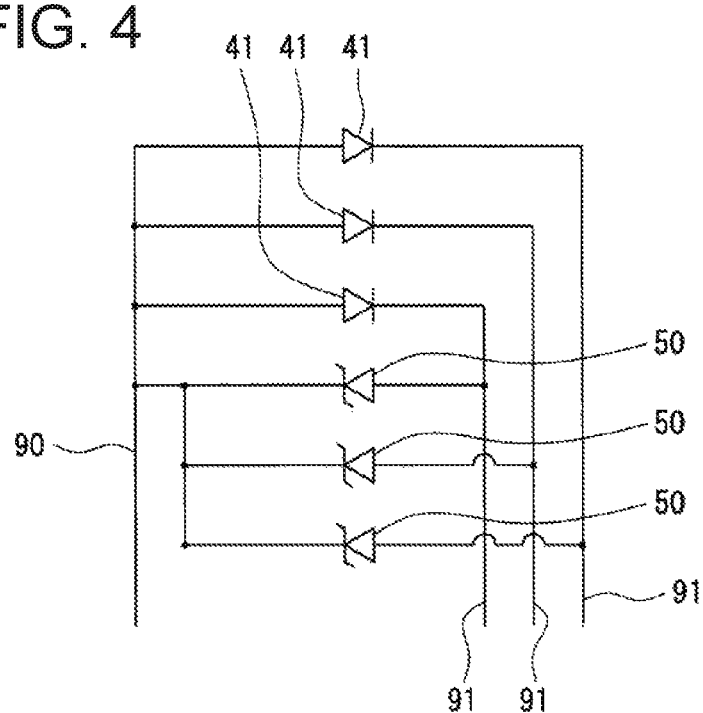
FIG. 4 is a circuit diagram of the light source module according to the exemplary embodiment.

FIG. 4 is a circuit diagram of the light source module 10. As illustrated in FIG. 4, the plurality of light sources 41 are connected with a plus-side wire 90 that is common among the light sources 41 and a plurality of minus-side wires 91 that are independent of each other. That is, the light source module 10 is provided with the same number of minus-side wires 91 as the number of the plurality of light sources 41 that constitute the light source array 40. Alternatively, a minus-side wire may be provided as a common wire, and the same number of plus-side wires as the number of the light sources 41 may be provided.

Here, the plus-side wire 90 of the light source module 10 is constituted by a first electric supply wire 23 (see FIG. 6), the first electric supply pad 25, a metal wire, the secondary-substrate-side first electric supply pad 15 and the like of the primary wiring substrate 20. The minus-side wire 91 is constituted by a second electric supply wire 24 (see FIG. 5), the second electric supply pad 26, a metal wire, the secondary-substrate-side second electric supply pad 16, the electric supply wire 14, the connector 17 and the like of the primary wiring substrate 20.

Since the light source module 10 is provided with the same number of minus-side wires 91 constituted by the second electric supply wire 24 and the like as the number of the light sources 41, it is possible to individually perform lighting control of the plurality of light sources 41. The secondary-substrate-side first electric supply pads 15 and the terminals of the connectors 17 are connected with the drive circuit 6 that includes the plurality of switching elements corresponding to the light sources 41. Turning the light sources 41 on/off, independently of each other, and the light modulation and the color toning, are performed by the drive circuit 6. The drive circuit 6 may control the individual light sources 41, based on the detection information of various sensors that are mounted on the automobile 1.

The light source module 10 further includes a plurality of protection diodes 50 that protect the light sources 41 against static electricity, surge voltage and the like. The same number of protection diodes 50 as the number of the light sources 41 are provided, and are electrically connected with the light sources 41 in one-to-one correspondence. As the protection diode 50 (the same goes for a protection diode 60 described later), for example, a Zener diode, a varistor diode, a trigger diode or the like can be applied. In the case where a Zener diode is used as the protection diode 50, preferably, the protection diode 50 should be connected in inverse-parallel to the light source 41, as shown in FIG. 4. Hereinafter, the description will be made on the assumption that the protection diodes 50, 60 are Zener diodes.

In the example shown in FIG. 4, the plurality of protection diodes 50 is connected with the plus-side wire 90 that is common among the light sources 41, and the plurality of minus-side wires 91 that are independent of each other. In this case, a plurality of second contacts 54 (see FIG. 9 and the like) connected with the minus-side wires 91 are provided, and first contacts 53 (see FIG. 9 and the like) connected with the plus-side wire 90 are provided in a ratio of one first contact 53 to a plurality of second contacts 54. That is, one first contact 53 is shared by a plurality of protection diodes 50.

Figure 5:
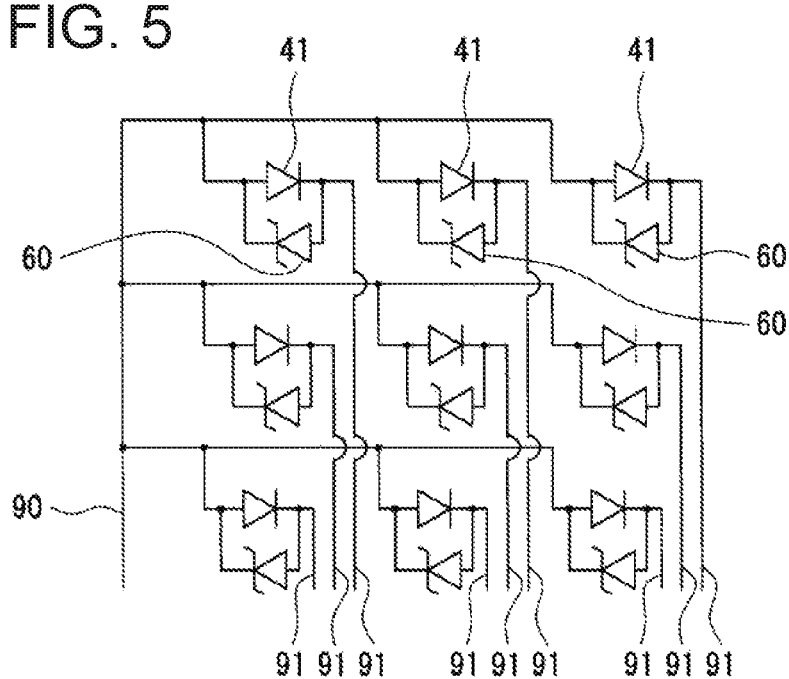
FIG. 5 is a circuit diagram of a light source module according to another exemplary embodiment.

Meanwhile, in an example shown in FIG. 5, first contacts and second contacts are provided in a ratio of one-to-one, and the plurality of protection diodes 60, without sharing the first contact, are connected with the plus-side wire 90 and the minus-side wires 91. Also in this case, preferably, the protection diodes 60 should be electrically connected with the light sources 41 in one-to-one correspondence, and should be connected in inverse-parallel to the light sources 41.

That is, preferably, the plurality of light sources 41 should include light-emitting diodes (LEDs), the plurality of protection diodes 50, 60 should be Zener diodes, and the Zener diodes should be connected in inverse-parallel to the LEDs, respectively. The breakdown voltage of the Zener diode is appropriately adjusted depending on the drive voltage (for example, about 3.5 V), withstand voltage and the like of the LED. By connecting the protection diodes 50 in this way, when inverse voltage is applied to a light source circuit or when surge voltage is applied in the forward direction, electric current flows through the protection diodes 50, 60, so that the breakdown and impairment of the light sources 41 are prevented. On the other hand, when the normal drive voltage is applied in the forward direction, electric current does not flow through the protection diodes 50, 60, and the light sources 41 emit light.

Figure 6:
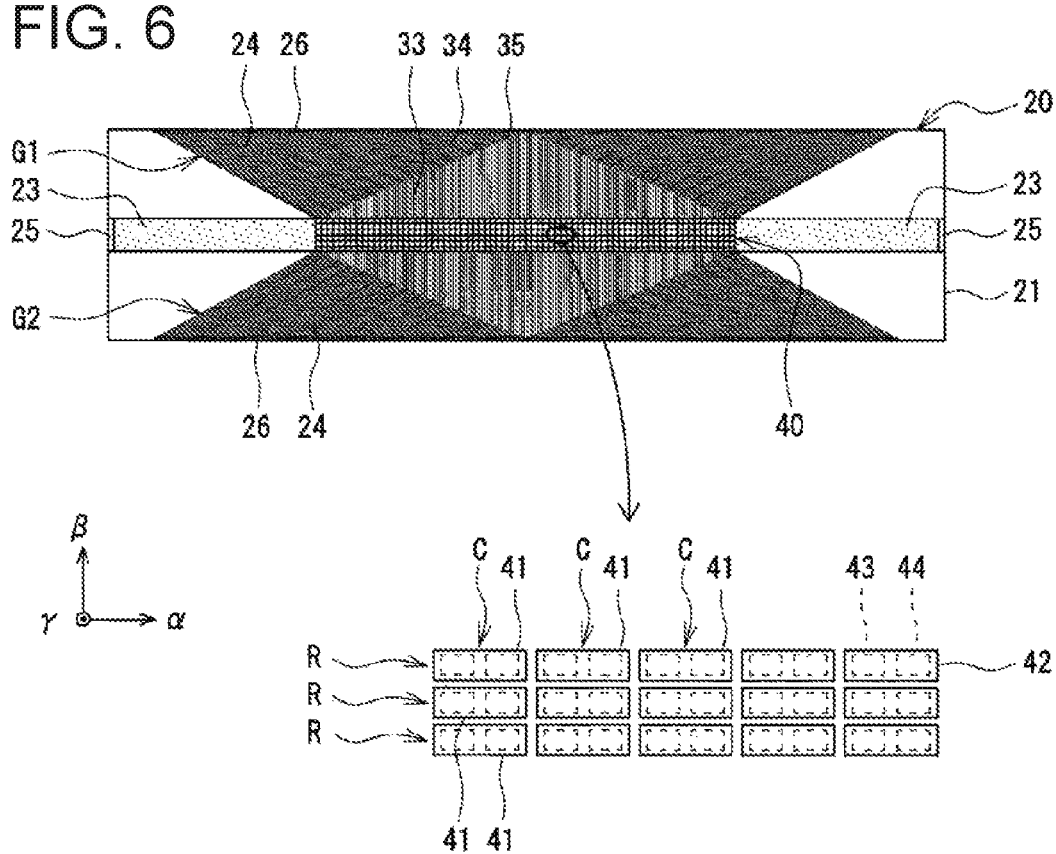
FIG. 6 is a plan view of a primary wiring substrate of the light source module according to the exemplary embodiment and a light source array mounted on a surface of the substrate (an insulating layer and a light-blocking member are not illustrated)

In the following, the configuration of the primary wiring substrate 20 and the light source array 40 will be described in detail, with reference to FIG. 6 to FIG. 8. FIG. 6 is a plan view showing the primary wiring substrate 20 and the light source array 40 mounted on the substrate, and shows a state in which the insulating layer 29 and the light-blocking member 46 are removed. In FIG. 6 and the like, reference character α denotes the row direction along the rows of the light sources 41, reference character β denotes the column direction along the columns of the light sources 41, and reference character γ denotes the thickness direction of the primary wiring substrate 20.

As illustrated in FIG. 6, the light source module 10 includes the primary wiring substrate 20 and the light source array 40 including the plurality of light sources 41 that are mounted on the surface of the substrate in a matrix. As described above, it is possible to individually perform the lighting control of the plurality of light sources 41. The light source array 40 includes a plurality of rows R of light sources 41 each of which is constituted by a plurality of light sources 41, and a plurality of columns C of light sources 41 each of which is constituted by a plurality of light sources 41. In the example shown in FIG. 6, more light sources 41 may be arranged along the row direction than along the column direction, and the number of the light sources 41 along the row direction may be the same as the number of the light sources 41 along the column direction.

In the embodiment, an array that is of an array of light sources 41 extending in a first direction and an array of the light sources 41 extending in a second direction and that is constituted by a larger number of light sources 41 is referred to as a "row R" and an array that is constituted by a smaller number of light sources 41 is referred to as a "column C". Here, the "row" may be referred to as a first array, and the "column" may be referred to as a second array. The "row direction" is a direction along the row R, the "column direction" is a direction along the column C, and the row direction and the column direction are orthogonal to each other.

The light source module 10 includes a first electric supply wire 23 for supplying electricity to each of the light sources 41 and a plurality of second electric supply wires 24 for supplying electricity to the light sources 41 respectively. Each of the first electric supply wire 23 and the second electric supply wire 24 is provided so as to extend along the column C of the light sources 41, and the second electric supply wire 24 is formed closer to a rear surface of the primary wiring substrate 20 than the first electric supply wire 23. Here, each electric supply wire functions as a heat transfer path for diffusing heat to the light sources 41.

The light source module 10 includes an electric supply pad that is provided at a peripheral portion of the primary wiring substrate 20. The electric supply pad includes two first electric supply pads 25 that are electrically connected with the secondary-substrate-side first electric supply pad 15 through metal wires, and a plurality of second electric supply pads 26 that are electrically connected with the secondary-substrate-side second electric supply pad 16 through metal wires. The first electric supply wire 23, which is a common wire among the light sources 41, is connected with the two first electric supply pads 25. On the other hand, the plurality of second electric supply wires 24, which are independent among the light sources 41, are connected with the plurality of the second electric supply pads 26, in one-to-one correspondence.

Preferably, the primary wiring substrate 20 should be a long substrate that extends in the row direction. By using a substrate corresponding to the shape of the light source array 40, it is possible to efficiently arrange the second electric supply wires 24 and the like, for example. An example of the primary wiring substrate 20 is a substrate having a thickness of about 0.1 mm to 2 mm. As the substrate on which the light source array 40 is mounted, a block substrate may be used. In the light source array 40, the length in the row direction is longer than the length in the column direction, that is, the row direction is the longer direction and the column direction is the shorter direction.

Each of the primary wiring substrate 20 and the light source array 40 has a planar-view rectangular shape. For example, the light source array 40 is arranged at a central portion of the primary wiring substrate 20, such that the longer sides of the primary wiring substrate 20 and the light source array 40 are nearly parallel to each other and the shorter sides of the primary wiring substrate 20 and the light source array 40 are nearly parallel to each other. The light source array 40 is shorter than the primary wiring substrate 20 in the lengths of the longer side and the shorter side. The light source array 40 has a thinner shape than the primary wiring substrate 20, and has a planar-view band shape. In the embodiment, the row direction is the same as the longer direction of the primary wiring substrate 20, and the column direction is the same as the shorter direction of the primary wiring substrate 20.

In the light source array 40, the lengths of all the rows R are the same, and the lengths of all the columns C are the same. The number of the light sources 41 constituting each row R is 10 to 100, for example, and is the same among the rows R. The number of the light sources 41 constituting each of the columns C (hereinafter, a plurality of light sources 41 constituting an identical column are referred to as "identical-column light sources 41") is 3 to 30, for example, and is the same among the columns C. Here, the number of light sources 41 does not need to be the same among the rows R or the columns C. In the headlight 2, preferably, the light source array 40 should be formed to have a long thin shape, and the light source module 10 should be arranged such that the longer direction is along the horizontal direction. For example, in a light source module that is applied for another use purpose, the number of the light sources 41 in the row direction and the number of the light sources 41 in the column direction may be the same as each other.

In each of the plurality of light sources 41 constituting the light source array 40, preferably, the length in the row direction should be longer than the length in the column direction. In other words, preferably, each light source 41 should be arranged such that the longer direction is along the row direction. Each light source 41 has a planar-view rectangular shape, for example. By matching the longer direction of each light source 41 with the row direction in which more light sources 41 are arrayed, a formation space for the second electric supply wire 24 is easily secured, for example, under (on the rear side of) the light sources 41, allowing a high-density arrangement of the light sources 41.

Each of the plurality of light sources 41 includes a light-emitting portion 42, a first electrode 43 and a second electrode 44. The light-emitting portion 42 has a structure in which a gallium nitride compound semiconductor layer containing a p-n junction is formed on a substrate such as a sapphire substrate, a spinel substrate, a gallium nitride substrate, a zinc carbide substrate and a silicon carbide, for example. In the embodiment, the first electrode 43 and the second electrode 44 are formed on one surface of the light-emitting portion 42. The first electrode 43 is a p-electrode (anode electrode), and the second electrode 44 is an n-electrode (cathode electrode).

As described above, the first electric supply pads 25 are electrically connected with the secondary-substrate-side first electric supply pad 15 through the metal wires. The first electric supply pads 25 are formed at both longer-directional end portions of the primary wiring substrate 20, along the shorter side of the primary wiring substrate 20. The length of each first electric supply pad 25 may be shorter than the length of the shorter side of the primary wiring substrate 20, and for example, may be equivalent to the column-directional length of the light source array 40. Preferably, the first electric supply pads 25 should be formed to be arrayed with the light source array 40 in the longer direction of the primary wiring substrate 20.

The first electric supply wire 23 connects the first electrode 43 of each light source 41 of the light source array 40 and the two first electric supply pads 25. Preferably, the first electric supply wire 23 should be linearly formed from both row-directional end portions of the light source array 40 along the row direction (the longer direction of the primary wiring substrate 20). The two first electric supply pads 25 are formed to be arrayed with the light source array 40 in the longer direction of the primary wiring substrate 20, and therefore, by linearly forming the first electric supply wire 23, it is possible to connect the light source array 40 and the first electric supply pads 25 by the shortest path. In this case, it is possible to efficiently radiate the heat of the light source array 40 through the first electric supply wire 23.

As described above, the plurality of second electric supply pads 26 are connected with the plurality of secondary-substrate-side second electric supply pads 16 through the metal wires, in one-to-one correspondence. The plurality of second electric supply pads 26 are formed at both shorter-directional end portions of the primary wiring substrate 20, respectively. Each second electric supply pad 26 has a planar-view square shape, for example.

On the primary wiring substrate 20, two arrays (hereinafter, referred to as "arrays R(26)"), each of which is formed by arraying a plurality of second electric supply pads 26 in a line, are formed along the longer direction of the substrate. Between the two arrays R(26), for example, the number of the second electric supply pads 26 is the same, and the interval between the second electric supply pads 26 is nearly the same.

The array R(26) of the second electric supply pads 26 is longer than the row-directional length of the light source array 40, and extends beyond positions corresponding to both row-directional ends of the light source array 40 to both longer-directional end sides of the primary wiring substrate 20. That is, the plurality of second electric supply pads 26 are formed to be longer in the longer direction of the primary wiring substrate 20 than the interval between the two light sources 41 that are arranged at both ends of the row R. In this case, the connection between the second electric supply pad 26 and the secondary-substrate-side second electric supply pad 16 becomes easy, and the heat of each light source 41 is easily diffused over a wide range of the primary wiring substrate 20, so that the heat radiation is enhanced.

The array R(26) of the second electric supply pads 26 may be formed over the entire longer-directional length of the primary wiring substrate 20, and for example, is formed to have a length of 1.5 to 3 times the longer-directional length of the light source array 40. Further, the second electric supply pads 26 may be formed along the shorter side of the primary wiring substrate 20, without contacting with the first electric supply pads 25.

The plurality of second electric supply wires 24 connect the second electrodes 44 of the light sources 41 of the light source array 40 and the plurality of second electric supply pads 26, in one-to-one correspondence. The plurality of second electric supply wires 24 are provided so as to extend from both column-directional end portions (both shorter-directional end portions) of the light source array 40 to both shorter-directional end portions of the primary wiring substrate 20, respectively. Since the plurality of second electric supply wires 24 extend to both ends of the light source array 40 in this way, the wiring space is easily secured, and the light sources 41 are easily secured densely. Further, the heat radiation of the light source array 40 is enhanced.

Preferably, each of groups G1, G2 of second electric supply wires 24 to be formed on both column-directional sides of the light source array 40 should be constituted by the same number of second electric supply wires 24 as half the number of the plurality of light sources 41 constituting the light source array 40.

Each of the groups G1, G2 of the second electric supply wires 24 broadens gradually as it extends from both column-directional end portions of the light source array 40 to both shorter-directional ends of the primary wiring substrate 20, and is formed to have a planar-view trapezoidal shape. Since the array R(26) of the second electric supply pads 26 extends beyond the positions corresponding to both row-directional ends of the light source array 40 to both longer-directional end sides of the primary wiring substrate 20, each of the groups G1, G2 of the second electric supply wires 24 has a shape that broadens in the longer direction of the substrate with distance from the light source array 40. In this case, the heat of each light source 41 is easily diffused over a wide range of the primary wiring substrate 20, so that the heat radiation is enhanced.

Preferably, the plurality of second electric supply wires 24 should include first linear portions 33 that extend from the column-directional end portions of the light source array 40, and second linear portions 34 that are connected with the first linear portions 33. At least one of light sources 41 arranged at a row-directional central portion of the light source array 40 may be connected with the second electric supply pad 26, by the shortest path, through a second electric supply wire 24 configured by only the first linear portion 33. Further, at least one of light sources 41 arranged at both longer-directional end portions of the light source array 40 is connected with the second electric supply pad 26, through a second electric supply wire 24 configured by only the second linear portion 34.

The light sources 41 arranged at the row-directional central portion of the light source array 40 are likely to have high temperatures due to being surrounded by many light sources 41. However, since the light sources 41 are connected with the second electric supply pads 26 at the first linear portions 33 that extend along the column direction, it is possible to efficiently radiate the heat of the light sources 41, and to suppress the rise in the temperature.

Preferably, the plurality of second electric supply wires 24 should be formed such that the inclination direction of the second linear portion 34 changes at the row-directional center of the light source array 40. In the plurality of second electric supply wires 24, preferably, the first linear portions 33 should be formed to be nearly parallel to each other, and the second linear portions 34 extending in the same direction should be formed to be nearly parallel to each other.

The plurality of second electric supply wires 24 including the first linear portions 33 and the second linear portions 34 are formed such that the length of the first linear portion 33 is longer, and the length of the second linear portion 34 is shorter as the position is closer to the row-directional center of the light source array 40 from both row-directional ends. A connection portion 35 between the first linear portion 33 and the second linear portion 34 is formed to be closer to the light source array 40 as the position becomes closer to both row-directional ends of the light source array 40 from the row-directional center, and a virtual line joining connection portions 35 is a straight line.

Figure 7:
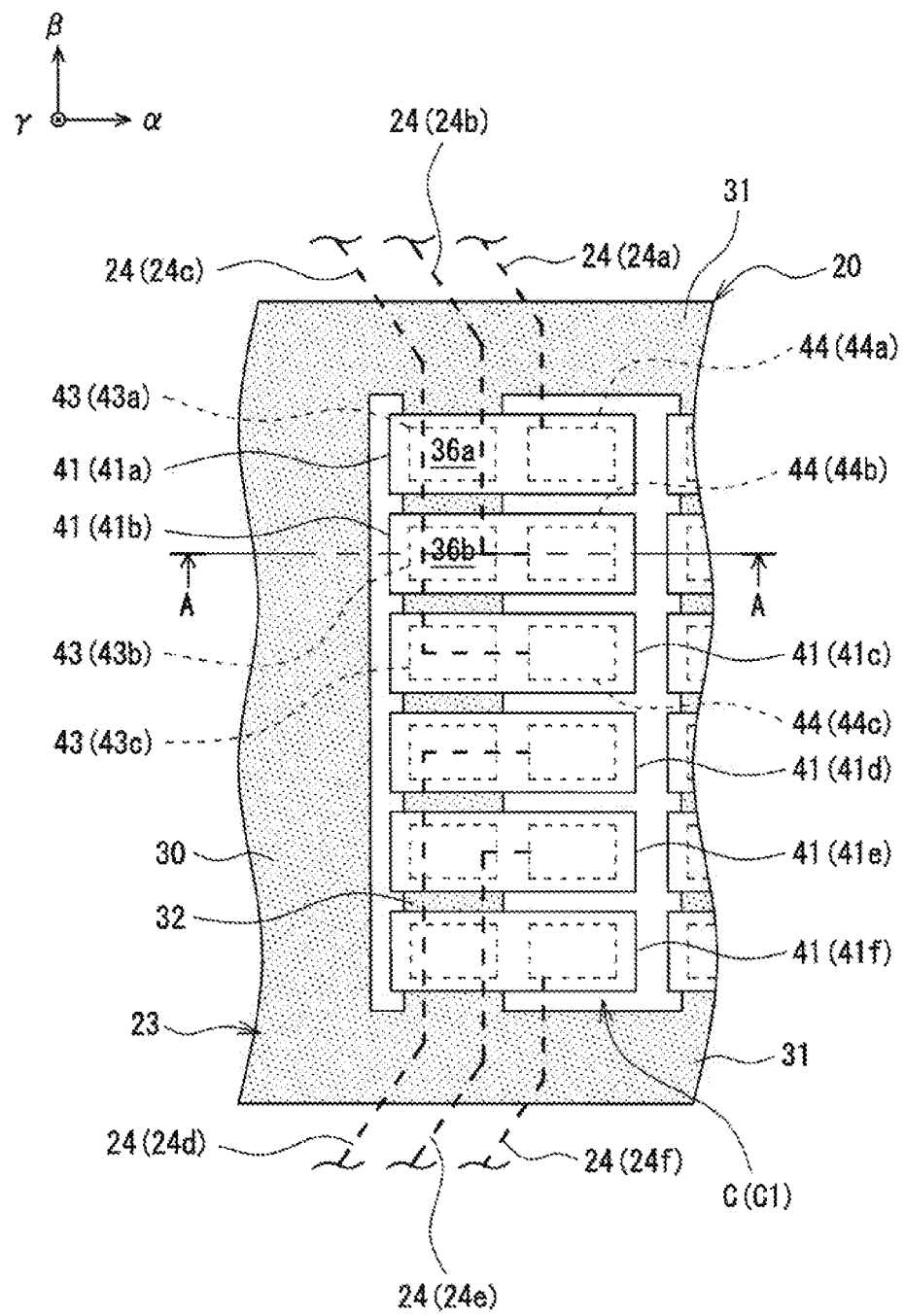
FIG. 7 is an enlarged view showing a part of FIG. 6.

FIG. 7 is an enlarged view showing a part of FIG. 6 (the insulating layer 29 and the light-blocking member 46 are not illustrated). FIG. 8 is a diagram showing a part of a section taken from line AA in FIG. 7. As illustrated in FIG. 7 and FIG. 8, the light sources 41 constituting the light source array 40 are connected with the first electric supply wire 23 that is common among the light sources 41 and the plurality of second electric supply wires 24 that are independent of each other. The single continuous first electric supply wire 23 is connected with all first electrodes 43 of the light sources 41, and on the other hand, the second electric supply wires 24 are connected with the second electrodes 44 of the light sources 41 in one-to-one correspondence.

Figure 8:
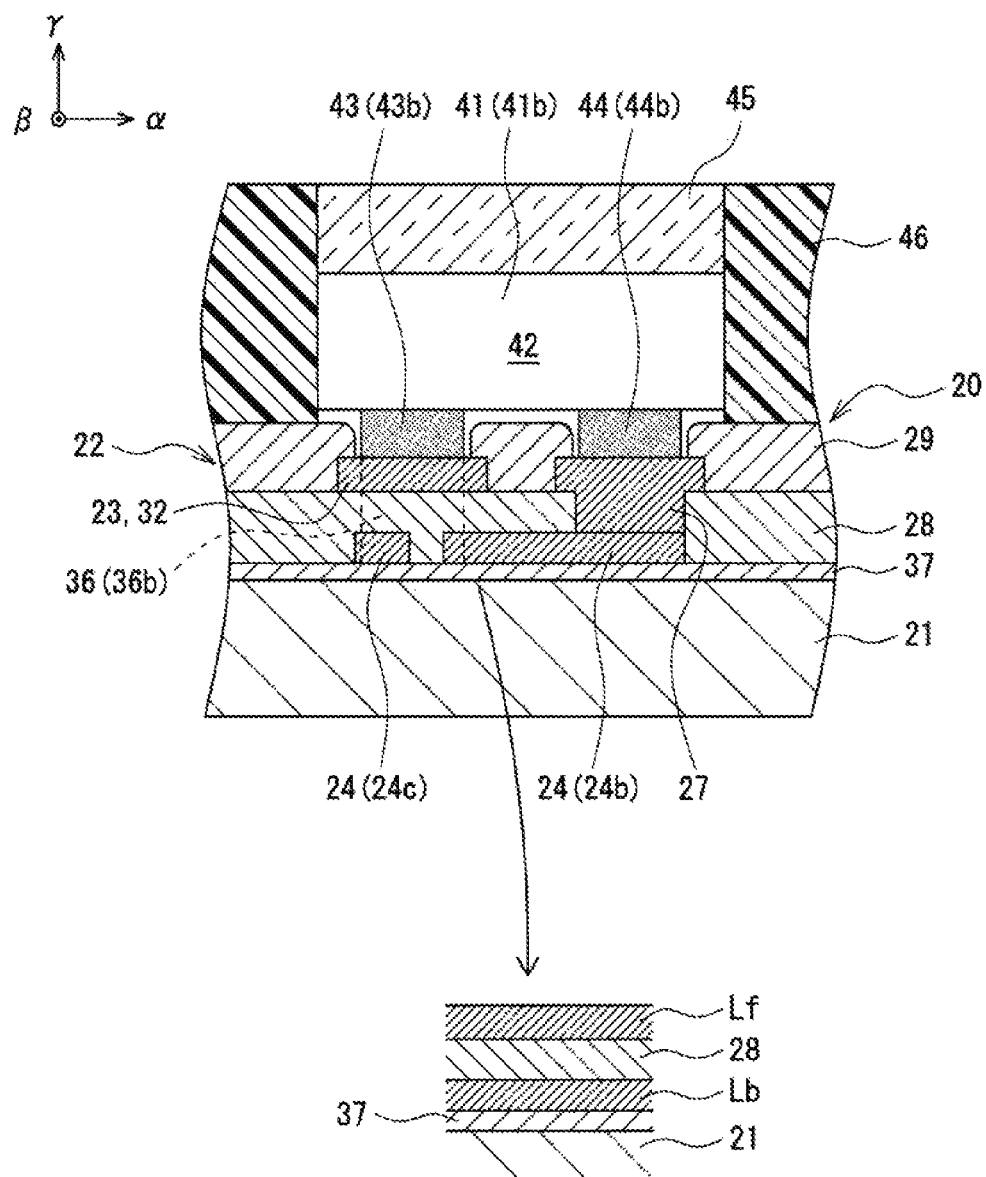
FIG. 8 is a diagram showing a part of a section taken from line AA in FIG. 7.

In the embodiment, the plurality of second electric supply wires 24 are formed closer to the rear side of the primary wiring substrate 20 than the first electric supply wire 23, and the second electric supply wires 24 are electrically connected with the second electrodes 44 of the light sources 41 through interlayer conducting paths 27 (see FIG. 8). The plurality of interlayer conducting paths 27 connect the second electric supply wires 24 and the second electrodes 44 of the light sources 41, in one-to-one correspondence. That is, the number of the formed interlayer conducting paths 27 is the same as the number of the light sources 41.

As illustrated in FIG. 8, the primary wiring substrate 20 includes a base substrate 21 and a wiring layer 22 formed on the surface side of the base substrate 21. The plurality of light sources 41 constituting the light source array 40 are mounted on the surface of the wiring layer 22. The base substrate 21 is a parent material of the primary wiring substrate 20, and functions as a support for the wiring layer 22. As described later in detail, in the embodiment, the protection diodes 50 are formed in the base substrate 21 of the primary wiring substrate 20.

The base substrate 21 may be configured by a metal substrate, a semiconductor substrate, a ceramic substrate, a resin substrate or the like, and preferably, should be configured by a semiconductor substrate of silicon, gallium arsenide or the like. That is, preferably, the primary wiring substrate 20 should include a semiconductor layer (semiconductor substrate), and the plurality of protection diodes 50 should be formed in the semiconductor layer. In the embodiment, a silicon substrate is applied to the base substrate 21. For example, the first electric supply wire 23, the second electric supply wire 24 and the interlayer conducting path 27 are composed of a metal containing aluminum, copper, tungsten, silver, gold or the like as the primary component. Preferably, aluminum or copper should be used, in consideration of conductivity, material cost and the like.

The wiring layer 22 includes the first electric supply wire 23, the second electric supply wire 24, and an insulating layer 28 for insulating the electric supply wires. The wiring layer 22 functions as a heat transfer layer. The wiring layer 22 is formed by laminating an insulating layer 37, the second electric supply wire 24, the insulating layer 28 and the first electric supply wire 23 in that order from the base substrate 21. Further, in the wiring layer 22, there is formed the interlayer conducting path 27 connected with the second electric supply wire 24 while piercing the insulating layer 28. The wiring layer 22 includes the interlayer conducting path 27 that is in the insulating layer 28 and connects the second electrode 44 and one of the plurality of second electric supply wires 24.

The wiring layer 22 includes the insulating layer 37 (first insulating layer) that is formed on the surface of the base substrate 21, and a rear-side metal layer Lb that contains the plurality of second electric supply wires 24 formed on the insulating layer 37. In the embodiment, since a silicon substrate is applied to the base substrate 21, it is necessary to provide the insulating layer 37 for securing the insulation between the silicon substrate and the rear-side metal layer Lb. Further, the wiring layer 22 includes the insulating layer 28 (second insulating layer) that is formed on the rear-side metal layer, and a front-side metal layer Lf that contains the first electric supply wire 23 formed on the insulating layer 28.

In the embodiment, the first electric supply wire 23 is configured by the front-side metal layer Lf, and the plurality of second electric supply wire 24 is configured by the rear-side metal layer Lb. Further, a surface layer of the interlayer conducting path 27 that is connected with the second electrode 44 of the light source 41 is configured by the front-side metal layer Lf. Each electric supply pad can be Ruined by depositing a metal layer at the end portion of the corresponding electric supply wire by plating or the like. The insulating layer 37 is composed of an insulating metal compound that contains silicon oxide or the like as the primary component, for example, and may be formed by CVD or may be formed by the oxidation treatment of the surface of the silicon substrate.

The rear-side metal layer Lb can be formed on the surface of the base substrate 21, by CVD, sputtering, vapor deposition, plating or the like. The front-side metal layer Lf can be formed using the same method. Preferably, the plurality of second electric supply wires 24 should be formed by patterning of the rear-side metal layer Lb. The pattern of the electric supply wires can be formed by printing with a conductive ink. The second contacts 54 of the protection diodes 50 described later can be formed by performing the film formation of the rear-side metal layer Lb after removing a part of the insulating layer 37 by etching.

The insulating layer 28 is formed on the surface of the rear-side metal layer Lb after patterning, that is, on the surface of the second electric supply wire 24, and a part of the insulating layer 28 is formed on the surface of the base substrate 21 that is exposed by the removal of the rear-side metal layer Lb. The insulating layer 28, for example, is composed of an insulating metal compound that contains silicon oxide or the like as the primary component, and is formed by CVD.

The front-side metal layer Lf is formed on the surface of the insulating layer 28, after removing, by etching, portions of the insulating layer 28 where the interlayer conducting paths 27 are formed, that is, after forming opening portions for exposing parts of the second electric supply wires 24. On this occasion, the metal layer is also deposited on the opening portions and the exposed parts of the second electric supply wires 24. Preferably, the first electric supply wire 23 and the interlayer conducting paths 27 that are separated from each other should be formed by patterning of the front-side metal layer Lf. The first contact 53 of the protection diodes 50 described later can be formed by removing, by etching, parts of the insulating layers 28, 37 at a position where the rear-side metal layer Lb is not formed, and thereafter performing the film formation of the front-side metal layer Lf. The first contact 53 may be formed by forming a low layer portion of a contact with the base substrate 21 at the time of the film formation of the rear-side metal layer Lb and depositing the front-side metal layer Lf on the low layer portion.

For forming the plurality of second electric supply wires. 24, the wiring layer 22 can be formed as a multi-layer structure in which insulating layers and metal layers are alternately laminated. However, from a standpoint of productivity or the like, preferably, the plurality of second electric supply wires 24 should be formed by a single metal layer. In the embodiment, all second electric supply wires 24 are formed on an identical plane, by patterning of the rear-side metal layer Lb. As described later, by improving the formation pattern of the second electric supply wires 24 that pass through the rear sides of the light sources 41, it is possible to form many second electric supply wires 24 without forming the primary wiring substrate 20 as multiple layers.

On the outermost surface of the wiring layer 22, the insulating layer 29 may be formed at the region other than portions corresponding to the electric supply pads and the electrodes of the light sources 41. The insulating layer 29 has a function to cover and protect the surface of the first electric supply wire 23. The insulating layer 29 may be composed of a photosensitive resin that is used as a photoresist.

The light source module 10 may include a transparent cover 45 that covers each of the surfaces of the light-emitting portions 42 of the light sources 41. The light source 41 that is an LED emits white light, for example, by converting part of blue light of the light source 41 into light having a long wavelength, using a fluorescent substance, and mixing the light with the other part of the blue light. An example of the transparent cover 45 is a ceramic containing a fluorescent substance, and may be a glass containing a fluorescent substance. The transparent cover 45 has a function to convert the wavelength of the light of the light source 41 and to protect the light source 41.

The light source module 10 may include the light-blocking member 46 that is provided around the light source array 40 so as to surround the four sides of the light source array 40 and that is filled into the gaps among the light sources 41. The light-blocking member 46 covers each side surface of the light-emitting portions 42 and the transparent cover 45, and prevents the light of each of the light sources 41 from being emitted in the planar direction of the primary wiring substrate 20. The light-blocking member 46 has a function to reflect the light of the light source 41. For the light-blocking member 46, for example, a silicone resin containing a white pigment is used.

As illustrated in FIG. 7, the first electric supply wire 23 includes a first principal portion 30 that is formed from a row-directional end portion of the light source array 40 along the row direction, and two second principal portions 31 that are formed on both shorter-directional sides of the light source array 40 so as to sandwich the light source array 40. In the embodiment, first principal portions 30 are linearly formed from both row-directional end portions of the light source array 40 toward the two first electric supply pads 25, respectively. The two second principal portions 31 are connected with the first principal portions 30 that are formed on both row-directional sides of the light source array 40.

The first electric supply wire 23 includes a plurality of branching portions 32 that are formed along the columns C of the light sources 41 so as to branch from the second principal portion 31, respectively. The number of the formed branching portions 32 is the same as the number of the columns C of the light sources 41. The plurality of branching portions 32 are formed along the column direction, nearly parallel to each other. Each of the plurality of branching portions 32 is formed over the entire length of the column C, preferably, over the two second principal portions 31.

Each branching portion 32 is connected with all first electrodes 43 of the light sources 41 constituting the column C. That is, the plurality of light sources 41 are arranged along the branching portions 32 formed on the primary wiring substrate 20, and thereby, the plurality of columns C are formed. The branching portion 32 is a common wire that is shared by the identical-column light sources 41. The first electrode 43 may be bonded to the branching portion 32, using a metal bump or a conductive adhesive, or may be soldered. The branching portion 32 is formed to be wider than the row-directional length of the first electrode 43, in order to avoid the first electrode 43 from protruding out of the branching portion 32. Preferably, the branching portion 32 should be formed in the range of the row-directional length of the light source 41, so as not to interfere with the adjacent column C.

Each of the first principal portion 30, the second principal portion 31 and the branching portion 32 is formed to have a planar-view band shape. The first principal portion 30 has the greatest width, and the second principal portion 31 has the second greatest width. For example, the first principal portion 30 is formed to have a width equivalent to the column-directional length of the light source array 40 or a width equal to or greater than the column-directional length of the light source array 40. Particularly, a high electric current flows through the first principal portion 30, and therefore, preferably, the first principal portion 30 should be formed to have a wide width such that the heat generation is suppressed. Further, by forming the first principal portion 30 with a wide width, the heat radiation of the light source array 40 is enhanced.

The plurality of second electric supply wires 24 are formed on the rear side of the light source array 40, along the columns C of the light sources 41, respectively. As described above, the second electric supply wires 24 are formed closer to the rear side of the primary wiring substrate 20 than the first electric supply wire 23, and are connected with the second electrodes 44 of the light sources 41 through the interlayer conducting paths 27 (see FIG. 8), in one-to-one correspondence. The plurality of interlayer conducting paths 27 are formed immediately below the portions where the second electrodes 44 of the light sources 41 are arranged, respectively, and parts of the second electric supply wires 24 are formed immediately below the interlayer conducting paths 27, respectively. That is, the second electrodes 44, the interlayer conducting paths 27 and the second electric supply wires 24 are formed to overlap with each other in the thickness direction of the primary wiring substrate 20.

The surface layer portion of the interlayer conducting path 27 that is connected with the second electrode 44 is formed to be greater than the second electrode 44. The second electrode 44 may be bonded to the surface layer portion of the interlayer conducting path 27, using a metal bump or a conductive adhesive, or may be soldered.

In the following, the description will be made on the assumption that the number of the identical-column light sources 41, which are the plurality of light sources 41 constituting an identical column, is six. In an example shown in FIG. 7, six identical-column light sources 41a to 41f constituting a column C1 are arranged along the shorter direction of the primary wiring substrate 20, at nearly equal intervals.

As described above, each of the plurality of light sources 41 constituting the light source array 40 is arranged such that the longer direction is along the row direction in which more light sources 41 are arrayed. That is, each light source 41 is arranged such that the longer direction is orthogonal to the plurality of second electric supply wires 24 formed along the column C. For arraying the light sources 41 densely, it is necessary to form six second electric supply wires 24a to 24f to be connected with the six identical-column light sources 41a to 41f, in the range of a column C1, such that the second electric supply wires 24a to 24f do not interfere with the second electric supply wires 24 on the adjacent column C. Therefore, preferably, the longer direction of each light source 41 should be along the row direction for broadening the formation space for the second electric supply wires 24.

The plurality of second electric supply wires 24 to be connected with the identical-column light sources 41 are formed to be divided to both column-directional sides of the light source array 40, and the groups G1, G2 (see FIG. 6) of the second electric supply wires 24 are formed on both column-directional sides, respectively. For example, among the second electric supply wires 24a to 24f to be connected with the identical-column light sources 41a to 41f, three second electric supply wires 24a to 24c are provided so as to extend to one side in the column direction of the light source array 40, and three second electric supply wires 24d to 24f are provided so as to extend to the other end in the column direction of the light source array 40.

As illustrated in FIG. 7 and FIG. 8, preferably, the second electric supply wire 24 to be connected with the identical-column light sources 41 should be provided so as to extend through regions 36 immediately below the first electrodes 43 of one or a plurality of identical-column light sources 41. Here, the region 36 immediately below the first electrode 43 means a region that overlaps with the first electrode 43 in the thickness direction of the primary wiring substrate 20, on the rear side of the first electrode 43. The second electric supply wire 24a to be connected with the identical-column light source 41a positioned at an end of the column C1 is provided so as to extend to one side in the column direction of the light source array 40, without passing through the rear side of another light source 41.

For example, the second electric supply wire 24b to be connected with the identical-column light source 41b is provided so as to extend to one side in the column direction, through the rear side of the identical-column light source 41a. The second electric supply wire 24c to be connected with the identical-column light source 41c is provided so as to extend to one side in the column direction, through the rear sides of the identical-column light sources 41a, 41b. The second electric supply wire 24b is formed at a region 36a immediately below a first electrode 43a, and the second electric supply wire 24c is formed at regions 36a, 36b immediately below first electrodes 43a, 43b.

In the case where the plurality of second electric supply wires 24 are formed by a small number of layers illustrated in FIG. 8, the second electric supply wires 24a, 24b exist in an identical layer, on one side in the column direction of the second electric supply wire 24c. Therefore, it is difficult to extend the second electric supply wire 24c from just under a second electrode 44c along the column direction straight. The same goes for the second electric supply wire 24b. In the embodiment, by forming the second electric supply wire 24 at the region 36 immediately below the identical-column light source 41, it is possible to prevent interference among the second electric supply wires 24, and to achieve a high-density arrangement of the light sources 41 without forming the primary wiring substrate 20 as multiple layers.

The plurality of second electric supply wires 24 may be provided in parallel to the column direction, at the regions 36 immediately below the first electrodes 43 of one or a plurality of identical-column light sources 41. In the example shown in FIG. 7, the two second electric supply wires 24b, 24c are provided in parallel to the column direction, at the region 36a immediately below the identical-column light source 41a. Preferably, a plurality of second electric supply wires 24 to be provided at one region 36 should be formed nearly parallel to each other, at regular intervals.

In the light source module 10, preferably, a vicinal wire that is of the second electric supply wires 24 passing through a region 36 and that is closest to the second electrode should be a wire that is connected with an adjacent light source 41 adjacent to the identical-column light source 41 corresponding to this region 36. For example, the wire that is of the second electric supply wires 24b, 24c passing through the region 36a and that is closest to the second electrode 44a is the second electric supply wire 24b that is connected with the identical-column light source 41b. By adopting such a wiring pattern, it is possible to prevent a plurality of second electric supply wires 24 that are formed in an identical layer from interfering with each other.

Figure 9:
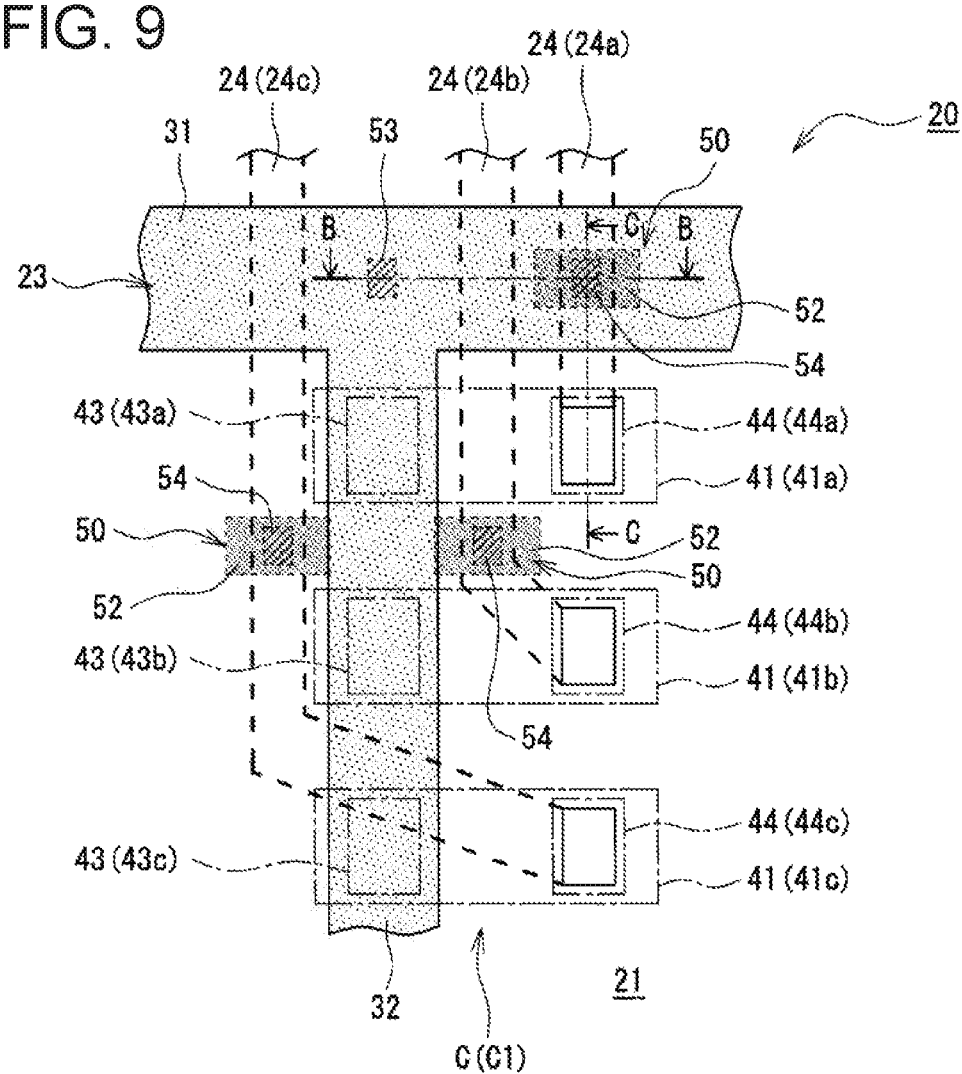
FIG. 9 is a plan view for describing a configuration of a protection diode according to an exemplary embodiment.
Figure 10:
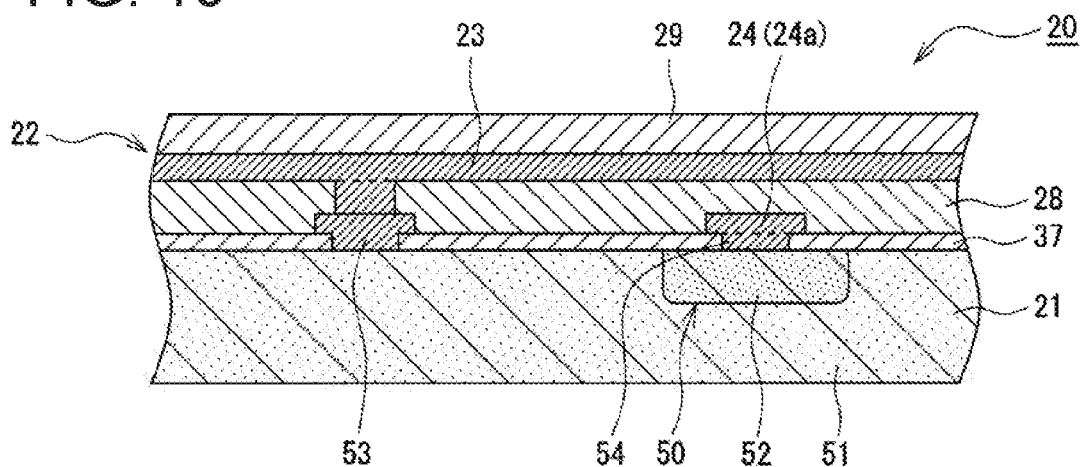
FIG. 10 is a sectional view taken from line BB in FIG. 9.

In the following, the configuration of the primary wiring substrate 20 in which the protection diodes 50 are formed will be described in further detail, with reference to FIG. 9 to FIG. 11. FIG. 9 is an enlarged plan view of a part of the primary wiring substrate 20 (the insulating layer 29 is not illustrated), and the light sources 41 are shown by alternate long and short dash lines. In FIG. 9, for clarification of the figure, the second electric supply wire 24c is illustrated outside the column C1. However, as described above, preferably, the second electric supply wire 24c should be formed in the range of the column C1. FIG. 10 is a sectional view taken from line BB in FIG. 9, and FIG. 11 is a sectional view taken from line CC in FIG. 9.

Figure 11:
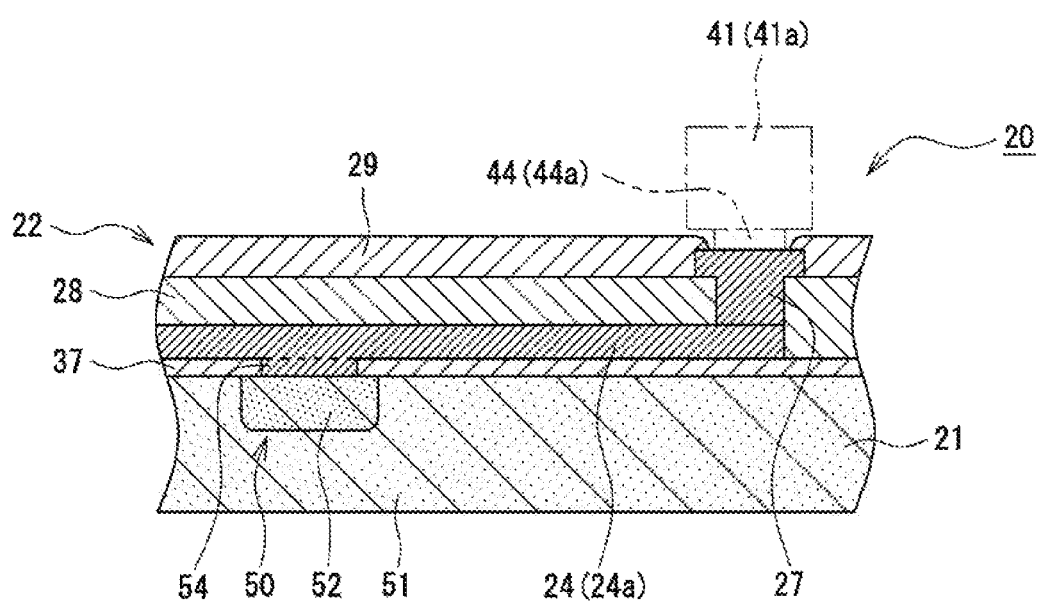
FIG. 11 is a sectional view taken from line CC in FIG. 9.

As illustrated in FIG. 9 to FIG. 11, in the primary wiring substrate 20, the protection diode 50 is formed for each of the plurality of second electric supply wires 24. Further, each of the plurality of protection diodes 50 is electrically connected with the first electric supply wire 23 as the common wire for the light sources 41 and the second electric supply wire 24 as the individual wire. Thereby, the protection diodes 50 are connected in parallel to the light sources 41 in one-to-one correspondence, and the light sources 41 can be protected against static electricity, surge voltage and the like.

As shown in FIG. 10 and FIG. 11, the protection diode 50 is formed in the base substrate 21 of the primary wiring substrate 20. In the embodiment, a silicon substrate is used as the base substrate 21, and the protection diode 50 is configured by a first conductivity type region 51 and a second conductivity type region 52 that are formed in the silicon substrate. The first conductivity type region 51 is an n-type region that is electrically connected with the first electric supply wire 23 on the anode side (p-side). The second conductivity type region 52 is a p-type region that is electrically connected with the second electric supply wire 24 on the cathode side (n-side).

Since the first conductivity type region 51 is an n-type region and the second conductivity type region 52 is a p-type region, a structure is formed in which the protection diode 50 is connected in inverse-parallel to the light source 41. For example, the first conductivity type region 51 is formed by using, as the base substrate 21, an n-type silicon substrate containing an n-type dopant such as phosphorus. In this case, the second conductivity type region 52 can be formed by doping the surface of the n-type silicon substrate with a p-type dopant such as boron. The concentrations of the dopants contained in the first conductivity type region 51 and the second conductivity type region 52 are appropriately adjusted depending on the breakdown voltage of a targeted Zener diode.

As described above, the primary wiring substrate 20 is a substrate that includes the base substrate 21, which is a silicon substrate, and the wiring layer 22 formed on the base substrate 21, and in which the n-type region and p-type region constituting, the protection diode 50 are formed on the base substrate 21. Further, the wiring layer 22 is provided with the plurality of contacts (the first contacts 53 and the second contacts 54) that electrically connect the protection diodes 50 and the electric supply wires, together with the first electric supply wire 23 and the second electric supply wire 24 that are connected with the light sources 41. The first contact 53 connects the first electric supply wire 23 and the first conductivity type region 51, and the second contact 54 connects the second electric supply wire 24 and the second conductivity type region 52.

As illustrated in FIG. 9, on the surface of the base substrate 21, a plurality of second conductivity type regions 52 are scattered at various points. In the embodiment, the first conductivity type region 51 that is an n-type region is formed as a single continuous layer, and the plurality of second conductivity type regions 52 that are p-type regions are formed on the surface of the base substrate 21. Each of the protection diodes 50 is formed by the p-n junction of the n-type region and the p-type region. Therefore, the number of the protection diodes 50 is the number of the second conductivity type regions 52, and the positions of the protection diodes 50 are the positions of the second conductivity type regions 52. The second conductivity type region 52 is formed for each second electric supply wire 24, and is connected with the second electric supply wire 24 in one-to-one correspondence.

Preferably, the plurality of second conductivity type regions 52 should be respectively formed at regions that overlap with the plurality of second electric supply wires 24 in the thickness direction of the primary wiring substrate 20, that is, at regions immediately below the second electric supply wires 24. Since the second conductivity type regions 52 and the second electric supply wires 24 are connected in one-to-one correspondence, at least one second conductivity type region 52 is formed immediately below each second electric supply wire 24. In other words, the second electric supply wires 24 are formed so as to pass over the second conductivity type regions 52 of the base substrate 21.

In the example shown in FIG. 9, the second conductivity type regions 52 (the protection diodes 50) are formed near the light sources 41. The second conductivity type regions 52 may be formed at regions that overlap with the light sources 41 in the thickness direction of the primary wiring substrate 20, that is, at regions immediately below the light sources 41. Further, the second conductivity type regions 52 may be formed at regions that overlap with the first electric supply wire 23 in the thickness direction of the primary wiring substrate 20, that is, at regions immediately below the first electric supply wire 23. For example, the second conductivity type region 52 corresponding to the second electric supply wire 24a is formed immediately below the second principal portion 31.

Figure 12:
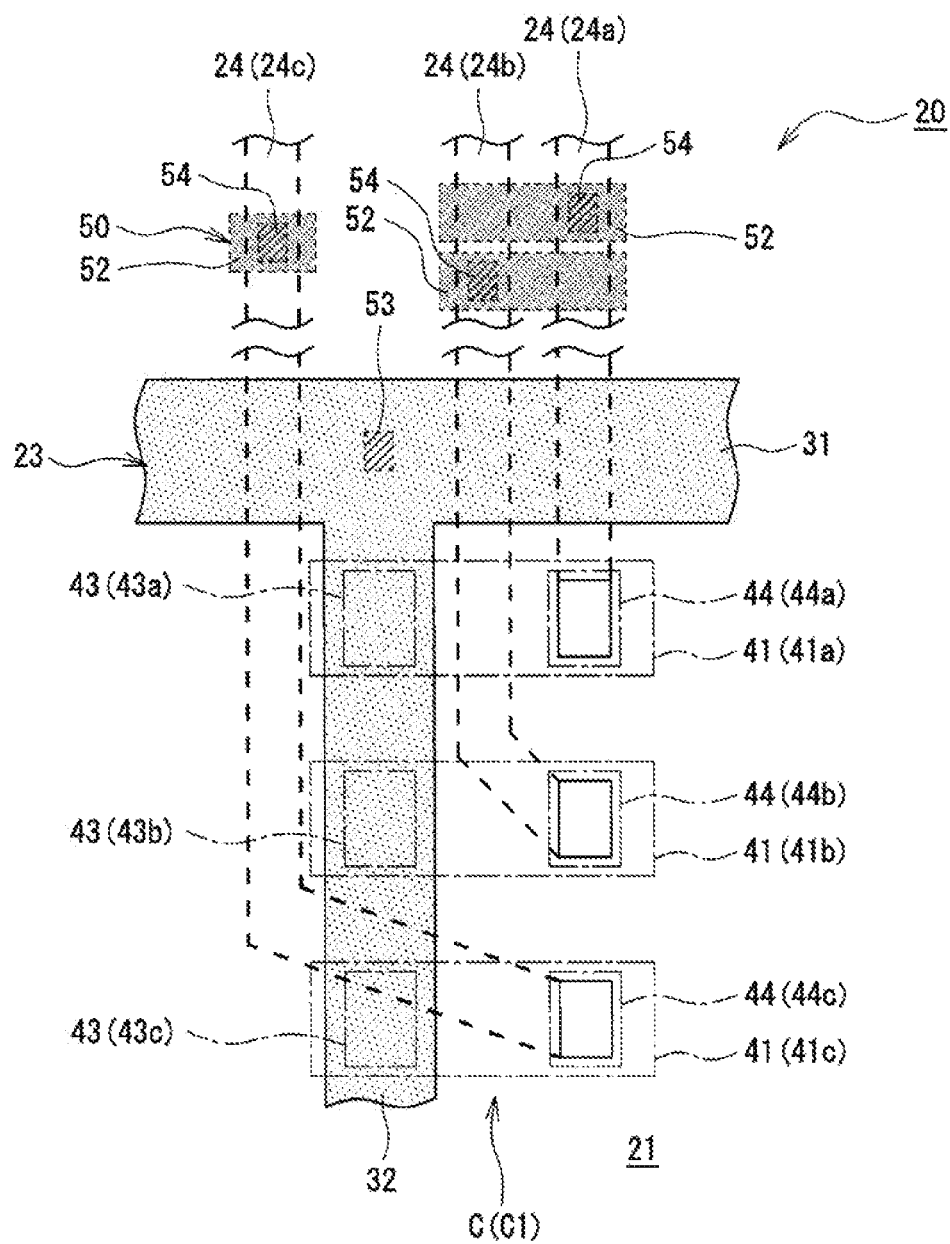
FIG. 12 is a diagram showing a modification of the protection diode according to the exemplary embodiment.

Although the second conductivity type regions 52 are formed near the light sources 41 in the example shown in FIG. 9, the second conductivity type regions 52 may be formed at positions away from the light sources 41 as illustrated in FIG. 12. Thus, the second conductivity type region 52 only needs to be formed immediately below the second electric supply wire 24, and the position is not particularly limited. However, the distance between the second conductivity type region 52 and the first contact 53 has influence on the breakdown voltage of the protection diode 50, and therefore, the position of the second conductivity type region 52 is sometimes restricted due to the relation with the breakdown voltage. Further, the second conductivity type region 52 may be formed across a plurality of second electric supply wires 24. However, in this case also, the second conductivity type region 52 is electrically connected with only one second electric supply wire 24.

As illustrated in FIG. 9 and FIG. 10, the first contact 53 is formed immediately below the first electric supply wire 23. The first contact 53 is formed in the thickness direction of the primary wiring substrate 20 so as to pierce the insulating layers 28, 37, and electrically connects the first electric supply wire 23 formed on the front side of the wiring layer 22 and the first conductivity type region 51 of the base substrate 21. The at least one first contact 53 is immediately below the first electric supply wire 23 in the insulating layer 28, 37. Since the second electric supply wire 24 is formed on the rear side of the first electric supply wire 23, the first contact 53 is formed so as to avoid the second electric supply wire 24. For example, the first contact 53 is formed at a position immediately below the second principal portion 31 where the second electric supply wire 24 is not formed.

The number of the first contacts 53 to be formed may be the same as the number of the second contacts 54, and in the embodiment, the first contact 53 may be formed in a ratio of one first contact to a plurality of second contacts 54. That is, the first contact 53 may be shared by a plurality of protection diodes 50. On the other hand, since the second contacts 54 connect the second electric supply wires 24 and the second conductivity type regions 52 in one-to-one correspondence, the number of the second contacts 54 to be formed is the same as the number of the second electric supply wires 24 and the number of the second conductivity type regions 52. The number, arrangement and the like of the first contacts 53 are not particularly limited, but the distance between the second conductivity type region 52 and the first contact 53 is sometimes restricted due to the relation with the breakdown voltage of the protection diode 50.

For example, each of at least one first contact 53 is provided for a column C1 or for a plurality of columns C1 of the light sources 41. In the embodiment, three second electric supply wires 24 are provided so as to extend from each column C to both column-directional sides of the light source array 40, and therefore, the first contact 53 may be formed immediately below each of the second principal portions 31 formed on both column-directional sides of the light source array 40. Although one first contact 53 may be formed immediately below each first principal portion 30, preferably, the first contact 53 should be formed in a ratio of one first contact to one or a plurality of columns C, in order to make the characteristic of the protection diode 50 uniform. For example, the first contact 53 is formed in the vicinity of each end of each column C, along the longer-direction of the second principal portion 31, at nearly equal intervals.

As illustrated in FIG. 9 to FIG. 11, the plurality of second contacts 54 are formed on the second conductivity type regions 52, respectively. One second contact 54 only needs to be formed for each second conductivity type region 52. The second contact 54 is formed in the thickness direction of the primary wiring substrate 20 so as to pierce the insulating layer 37, and electrically connects the second electric supply wire 24 formed on the insulating layer 37 and the second conductivity type region 52 of the base substrate 21. Each second contact 54 of the plurality of second contacts 54 overlaps with one of the plurality of second electric supply wires 24 and one of the plurality of second conductivity type regions 52 in the thickness direction of the primary wiring substrate 20, and the second contact 54 being in the insulating layer 37 to electrically connect the one of the plurality of second electric supply wires 24 and the one of the plurality of second conductivity type regions 52. The second contact 54 only needs to be formed in the thickness direction of the primary wiring substrate 20, in a range that overlaps with the second electric supply wire 24 and the second conductivity type region 52, and may be formed immediately below the interlayer conducting path 27 that connects the second electric supply wire 24 and the second electrode 44 of the light source 41.

Thus, according to the light source module 10 having the above configuration, the plurality of protection diodes 50 respectively connected with the light sources 41 are formed in the base substrate 21 of the primary wiring substrate 20, allowing a countermeasure against static electricity with space saving. For allowing an individual lighting control of the light sources 41, the same number of second electric supply wires 24 as the number of the light sources 41 are formed on the primary wiring substrate 20. Depending on the light source module 10, it is possible to provide the same number of protection diodes 50 as the number of the light sources 41, without interfering with the second electric supply wires 24. Further, depending on the light source module 10, it is possible to array many light sources 41 protected by the protection diodes 50, in a matrix and in a high density.

Figure 13:
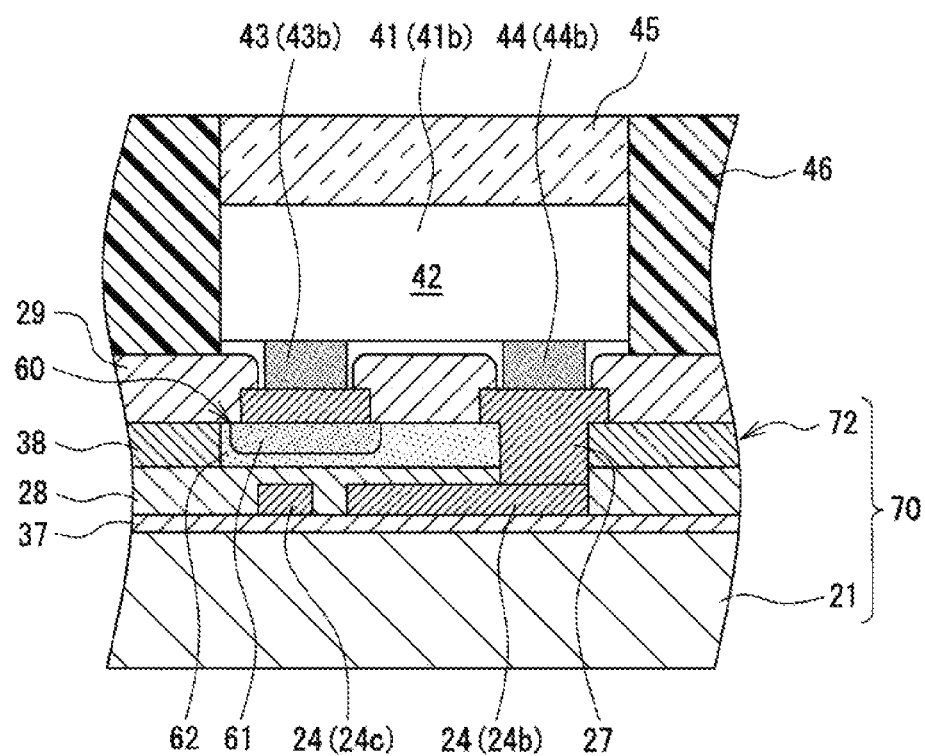
FIG. 13 is a sectional view for describing the configuration of a protection diode according to another exemplary embodiment.

In the above-described embodiment, the design can be changed without impairing the advantage of the present disclosure. For example, as illustrated in FIG. 13, the protection diode 60 can be formed between the first electric supply wire 23 and the second electric supply wires 24. The protection diode 60 is formed at a region that overlaps with the first electric supply wire 23 and the plurality of second electric supply wires 24 in the thickness direction of the substrate.

A primary wiring substrate 70 illustrated in FIG. 13 includes the base substrate 21 and a wiring layer 72, similarly to the primary wiring substrate 20. However, the primary wiring substrate 70 is different from the primary wiring substrate 20, in that the protection diode 60 to be electrically connected with the first electric supply wire 23 and the second electric supply wire 24 is formed in a semiconductor layer 38 of the wiring layer 72. In this case, as the base substrate 21, a semiconductor substrate need not be used, and the base substrate 21 may be a metal substrate, a ceramic substrate or a resin substrate. In the case where a substrate having no conductivity is used as the base substrate 21, the insulating layer 37 is unnecessary.

In the wiring layer 72, the plurality of second electric supply wires 24 are formed closer to the rear side of the primary wiring substrate 20 than the first electric supply wire 23 through the semiconductor layer 38. The wiring layer 72 includes the semiconductor layer 38, the insulating layer 28 formed between the semiconductor layer 38 and the plurality of second electric supply wires 24 (that is, the rear-side metal layer Lb), and the plurality of interlayer conducting paths 27. The plurality of interlayer conducting paths 27 are formed in the thickness direction of the primary wiring substrate 20 so as to pierce the semiconductor layer 38 and the insulating layer 28, and connect the plurality of second electric supply wires 24 and the second electrodes 44 of the plurality of light sources 41, in one-to-one correspondence.

That is, on the wiring layer 72, the semiconductor layer 38 is formed between the front-side metal layer Lf constituting the first electric supply wire 23 and the insulating layer 28. An example of the semiconductor layer 38 is a silicon layer. The silicon layer may be an amorphous silicon layer for which the film formation can be performed at a low temperature by CVD or the like. The protection diode 60 is configured by a first conductivity type region 61 and a second conductivity type region 62 that are formed on the semiconductor layer 38. Preferably, the first conductivity type region 61 to be electrically connected with the first electric supply wire 23 should be an n-type region, and the second conductivity type region 62 to be electrically connected with the second electric supply wire 24 should be a p-type region.

In the example shown in FIG. 13, the protection diode 60 is formed at a region that is adjacent to the interlayer conducting path 27, in the semiconductor layer 38, and is electrically connected with the second electric supply wire 24 through the interlayer conducting path 27. That is, the protection diode 60 is formed to be adjacent to the interlayer conducting path 27 in the direction (the planar direction of the base substrate 21) orthogonal to the thickness direction of the primary wiring substrate 70, and the second conductivity type region 62, which is a p-type region, contacts the interlayer conducting path 27. The first conductivity type region 61, which is an n-type region, is formed to be adjacent to the first electric supply wire 23 in the thickness direction of the primary wiring substrate 70. In this case, the protection diode 60 is directly connected with each electric supply wire, and therefore, the contacts are unnecessary.

Preferably, the same number of protection diodes 60 as the number of the light sources 41 should be provided, and should be connected in inverse-parallel to the light sources 41 (see FIG. 5). Preferably, the plurality of protection diodes 60, for example, should be respectively formed immediately below or near the light sources 41, for an easy connection between the interlayer conducting paths 27 and the second conductivity type regions 62 that correspond to the light sources 41. Immediately below the light sources 41, the second electric supply wires 24 connected with other identical-column light sources 41, as exemplified by the second electric supply wire 24b, are formed, and therefore, it is necessary to provide the insulating layer 28 between the protection diodes 60 and the second electric supply wires 24.

REFERENCE SIGNS LIST 1 automobile, 2 headlight, 3 battery, 4 vehicle body, 5 switch, 6 drive circuit, 7 case, 8 projection lens, 8A light incidence surface, 8B light emission surface, 9 fastening member, 10 light source module, 11 secondary wiring substrate, 12 base substrate, 14 electric supply wire, 15 secondary-substrate-side first electric supply pad, 16 secondary-substrate-side second electric supply pad, 17 connector, 18 through-hole, 20, 70 primary wiring substrate, 21 base substrate, 22, 72 wiring layer, 23 first electric supply wire, 24 second electric supply wire, 25 first electric supply pad, 26 second electric supply pad, 27 interlayer conducting path, 28, 29, 37 insulating layer, 30 first principal portion, 31 second principal portion, 32 branching portion, 33 first linear portion, 34 second linear portion, 35 connection portion, 36 region, 38 semiconductor layer, 40 light source array, 41 light source, 42 light-emitting portion, 43 first electrode, 44 second electrode, 45 transparent cover, 46 light-blocking member, 50, 60 protection diode, 51, 61 first conductivity type region, 52, 62 second conductivity type region, 53 first contact, 54 second contact, 90 plus-side wire, 91 minus-side wire, R row, C column, G1, G2 group, Lf front-side metal layer, Lb rear-side metal layer.

The invention claimed is:

1. A light source module, comprising:
a plurality of light-emitting elements;
a wiring substrate, a surface of which the plurality of light-emitting elements are mounted on in a matrix;
a first electric supply wire for supplying electricity to each of the plurality of light-emitting elements, the first electric supply wire being formed on the wiring substrate;
a plurality of second electric supply wires for supplying electricity to the plurality of light-emitting elements respectively, the plurality of second electric supply wires being formed on the wiring substrate; and
a plurality of protection diodes electrically connected with the first electric supply wire and the plurality of second electric supply wires,
wherein the wiring substrate includes a semiconductor layer, and
the plurality of protection diodes is configured by at least one first conductivity type region and a plurality of second conductivity type regions, the at least one first conductivity type region and the plurality of second conductivity type regions being in the semiconductor layer.

2. The light source module according to claim 1, wherein the wiring substrate further includes:
a semiconductor substrate including the semiconductor layer; and
a wiring layer on the semiconductor substrate, the wiring layer containing the first electric supply wire and the plurality of second electric supply wires.

3. The light source module according to claim 2, wherein the plurality of second conductivity type regions overlaps with the plurality of second electric supply wires in a thickness direction of the wiring substrate.

4. The light source module according to claim 3, wherein the wiring substrate further includes:
at least one first contact electrically connecting the first electric supply wire and the first conductivity type region; and
a plurality of second contacts electrically connecting the plurality of second electric supply wires and the plurality of second conductivity type regions in one-to-one correspondence.

5. The light source module according to claim 4, wherein each of the at least one first contact is provided for a column or for a plurality of columns of the plurality of light-emitting elements.

6. The light source module according to claim 4, wherein the wiring layer includes:
a first insulating layer on a surface of the semiconductor substrate;
a rear-side metal layer on the first insulating layer, the rear-side metal layer containing the plurality of second electric supply wires;
a second insulating layer on the rear-side metal layer; and
a front-side metal layer on the second insulating layer, the front-side metal layer containing the first electric supply wire.

7. The light source module according to claim 6, wherein each of the plurality of light-emitting elements includes a first electrode and a second electrode, and
the wiring layer includes an interlayer conducting path that penetrates through the second insulating layer and connects the second electrode and one of the plurality of second electric supply wires.

8. The light source module according to claim 6, wherein the at least one first contact is immediately below the first electric supply wire through the first insulating layer and the second insulating layer to electrically connect the first electric supply wire and the first conductivity type region, and
each second contact of the plurality of second contacts overlaps with one of the plurality of second electric supply wires and one of the plurality of second conductivity type regions in the thickness direction of the wiring substrate, the second contact penetrating through the first insulating layer to electrically connect the one of the plurality of second electric supply wires and the one of the plurality of second conductivity type regions.

9. The light source module according to claim 2, wherein the wiring layer includes:
   a first insulating layer on a surface of the semiconductor substrate;
   a rear-side metal layer on the first insulating layer, the rear-side metal layer containing the plurality of second electric supply wires;
   a second insulating layer on the rear-side metal layer; and
   a front-side metal layer on the second insulating layer, the front-side metal layer containing the first electric supply wire.

10. The light source module according to claim 2, wherein the semiconductor substrate is an n-type silicon substrate containing an n-type dopant,
   the first conductivity type region is a single continuous layer defined by the n-type silicon substrate, and
   each of the plurality of second conductivity type regions is on a surface of the n-type silicon substrate and doped with a p-type dopant.

11. The light source module according to claim 1, wherein the plurality of second electric supply wires is closer to a rear surface of the wiring substrate than the first electric supply wire,
   the wiring substrate further includes:
      an insulating layer between the semiconductor layer and the plurality of second electric supply wires; and
      interlayer conducting paths extending in a thickness direction of the wiring substrate through the semiconductor layer and the insulating layer to electrically connect the plurality of second electric supply wires and the plurality of light-emitting elements in one-to-one correspondence, and
   the plurality of protection diodes is respectively at regions in the semiconductor layer, and is electrically connected with the plurality of second electric supply wires via the interlayer conducting paths in one-to-one correspondence, the regions in the semiconductor layer being adjacent to the interlayer conducting paths.

12. The light source module according to claim 11, wherein
   at least one of the plurality of protection diodes overlaps with the first electric supply wire and at least one of the plurality of second electric supply wires in the thickness direction of the wiring substrate.

13. The light source module according to claim 1, wherein the plurality of light-emitting elements includes semiconductor light-emitting elements,
   the plurality of protection diodes includes Zener diodes, and
   the Zener diodes are connected in inverse-parallel to the semiconductor light-emitting elements.

14. An illumination device comprising the light source module according to claim 1.

15. A moving body comprising the light source module according to claim 1.

* * * * *